United States Patent [19]
Williams

[11] Patent Number: 5,557,642
[45] Date of Patent: Sep. 17, 1996

[54] DIRECT CONVERSION RECEIVER FOR MULTIPLE PROTOCOLS

[75] Inventor: Tim A. Williams, Danville, Calif.

[73] Assignee: Wireless Access, Inc., Santa Clara, Calif.

[21] Appl. No.: 337,962

[22] Filed: Nov. 14, 1994

Related U.S. Application Data

[63] Continuation of Ser. No. 936,361, Aug. 25, 1992, abandoned.

[51] Int. Cl.$^6$ .................................................... H03K 9/00
[52] U.S. Cl. .................... 375/316; 375/324; 375/350; 455/323; 455/339; 455/340; 341/143; 364/724.04
[58] Field of Search .............................. 341/77, 143, 155, 341/123, 122, 156; 364/724.01, 724.1; 455/313, 311, 323, 339, 340; 375/268, 271, 244, 247, 316, 320, 322, 324, 326, 350

[56] References Cited

U.S. PATENT DOCUMENTS

| | | | |
|---|---|---|---|
| 4,862,169 | 8/1989 | Van Bavel et al. | 341/143 |
| 5,003,621 | 3/1991 | Gailus | 455/209 |
| 5,030,954 | 7/1991 | Ribner | 372/29 |
| 5,157,343 | 10/1992 | Voorman | 329/319 |
| 5,157,395 | 10/1992 | Del Signore et al. | 364/724.1 |
| 5,220,583 | 6/1993 | Solomon | 375/82 |
| 5,243,343 | 9/1993 | Moriyasu | 341/123 |
| 5,283,581 | 2/1994 | Miki et al. | 341/156 |

OTHER PUBLICATIONS

Anvari, K., et al., *Performance of a Direct Conversion Receiver with pi/4–dgpsk Modulated Signal*, Proceedings of the 41st IEEE Vehicular Technology Conference, May 1991, pp. 822–823.

Wozencraft and Jacobs, *Principals of Communication Engineering*, John Wiley and Sons, 1965, Chapter 4, pp. 211–285.

Sevenhans, J., et al., *An Integrated Si Bipolar RF Transceiver for a zero IF 900 MHz GSM Digital Mobile Radio Frontend of a Hand Portable Phone*, IEEE 1991 Custom Integrated Circuits Conference, Paper 7.7.

Schreiser, R., et al., *Decimation for Bandpass Sigma–Delta Analog–to–Digital Conversion*, IEEE 1990 Custom Integrated Circuits Conference, pp. 1801–1804.

Ping, L., *Oversampling Analog/Digital Converters with Finite Zeros in Noise Shaping Functions*, IEEE 1991 Custom Integrated Circuits Conference, pp. 1645–1648.

Tsurumi et al., *Design Study on a Direct Conversion receiver Front–End for 280 MHZ,and 2.6 GHZ Band Radio Communication Systems*, IEEE 1991, pp. 457–462.

Jacobs et al., *Design Techniques for MOS Switched Capacitor Ladder Fileters*, IEEE Trans. Circuits Syst., vol. CAS–25, No. 12, pp. 159–165.

*Oversampling Delta–Sigma Data Converters*, IEEE Press, The Institute of Electrical and Electronics Engineers, Inc., New York, A Novel Architecture Design for VLSI Implementation of an FIR Decimation Filter, by Hanafy Meleis.

Jantzi, S., et al., "A Fourth–Order Bandpass Sigma–Delta Modulator", IEEE Journal of Solid–State Circuits, vol. 28, No. 3, Mar. 1993, pp. 282–291.

Jantzi, S., et al., "Bandpass Sigma–Delta Analog–to–Digital Conversion", IEEE Transactions on Circuit Systems, vol. 38, No. 11, Nov. 1991, pp. 1406–1409.

Schreier, R., et al., "Decimation for Bandpass Sigma–Delta Analog–to–Digital Conversion", IEEE 1990, pp. 1801–1804.

Jantzi, S., et al. "A Bandpass εΔΔ/D Converter for a Digital AM Receiver" International Conference, 1991, Publ. No. 343, pp. 75–80.

*Primary Examiner*—Stephen Chin
*Assistant Examiner*—Amanda T. Le
*Attorney, Agent, or Firm*—Steven F. Caserza; Flehr, Hohbach, Test Albritton & Herbert

[57] ABSTRACT

A novel direct conversion receiver utilizing a sample and hold circuit for subsampling the input signal. The output of the sample and hold circuit is applied to a sigma-delta loop to provide a high speed low resolution data stream which in turn is applied to a decimator which provides a high precision, low data rate signal having quadrature outputs.

22 Claims, 4 Drawing Sheets

DIRECT CONVERSION RECEIVER FOR MULTIPLE PROTOCOLS

CROSS REFERENCE TO RELATED APPLICATIONS

This application is a continuation of U.S. application Ser. No. 07/936,361, filed Aug. 25, 1992 abandoned.

BACKGROUND

This invention pertains to receivers, and more specifically to a novel RF receiver which is capable of being remotely tuned in frequency and bandwidth.

The need for radio receivers is widespread, and a recent use which has experienced phenomenal growth is the cellular telephone. Cellular telephones have undergone a dramatic market growth in the past few years. These existing systems utilize analog FM modulation techniques. In order to transmit data, landline modem signals are transmitted over cellular systems by using the cellular telephone as a twisted pair replacement. The trend in the industry is toward replacing the analog FM system with digital modulation and transmission means, e.g. GSM, IS54, JDC. IS54 is a so-called dual mode system in which the existing analog and the new digital modulation must coexist. Thus one portable handset must be capable of communicating using either analog or digital cellular signals. Other types of signals are being transmitted over the cellular network, as described in U.S. Pat. No. 4,914,651. This diversity of signals causes the designer of terminal equipment to require a receiver which is capable of dealing with multiple modulation techniques, or "protocols."

FIG. 1 shows a typical prior art double conversion receiver architecture. Double conversion receiver 100 receives an RF input signal on antenna 101 which is applied to RF section 102. RF section 102 includes RF filter 103 (such as a Surface Acoustic Wave filter) which provides to low noise amplifier 104 an RF signal with a desired passband and including the desired signal to be received having a carrier frequency $\omega_C$. The output from low noise amplifier 104 is applied to automatic gain control circuit (AGC) 105 in order to provide an output signal to RF amplifier 106 of relatively constant amplitude independent of the amplitude of the RF signal received on antenna 101. AGC circuit 105 receives its control signal from any well-known means, for example an adaptive gain control loop implemented in the baseband portion of the receiver and for simplicity, not shown in FIG. 1. The output signal from RF amplifier 106 is applied to first mixer 107, which also receives a first local oscillator signal LO1 having a frequency $\omega_{LO1}$. The output signal from mixer 107 includes four primary frequency components: $\omega_C$, $\omega_{LO1}$, $\omega_C+\omega_{LO1}$, and $\omega_C-\omega_{LO1}$. The output from mixer 107 is applied to intermediate frequency (IF) stage 108 which includes amplifier 109 for amplifying the output signal from mixer 107. This amplified signal from amplifier 109 is applied to the bandpass filter 110 which is tuned to reject signals having frequencies $\omega_C$ and $\omega_{LO1}$, as well as one of the remaining signal components of the output signal from mixer 107. This remaining component is the IF signal of interest and corresponds to the RF signal received on antenna 101 translated to a new intermediate frequency $\omega_{IF}$. The output from band pass filter 110 is applied to the input of amplifier 111, whose output signal is applied to second mixer 112 for mixing with a second local oscillator signal LO2 having a frequency $\omega_{LO2}$.

The output signal from mixer 112 is applied to baseband circuitry 113, which includes baseband amplifier 114 which is in turn coupled to baseband filter 115. The output signal from second mixer 112 includes frequency components $\omega_{IF}$, $\omega_{LO2}$, $\omega_{IF}+\omega_{LO2}$, and $\omega_{IF}-\omega_{LO2}$. Baseband filter 115 is tuned to reject frequencies $\omega_{IF}$, $\omega_{LO2}$, as well as one of the remaining frequency components output from mixer 112. The remaining frequency component of the output signal of mixer 112 is passed by passband filter 115 as the desired baseband signal containing quadrature components I and Q representing the information stored in the modulated RF signal received at antenna 101.

The optimum receiver architecture for a vector based communication channel like those of interest in personal communications is discussed by Wozencraft and Jacobs, "Principals of Communication Engineering," Chapter 4, P 211–285, John Wiley and Sons, 1965. The quadrature demodulator receiver shown in FIG. 1 is a common implementation of the design discussed in Wozencraft and Jacobs' text.

Ian Sevenhans, Amoul Vanwelsenaers, I. Wenin, J. Baro, "An Integrated Si bipolar RF transceiver for a zero IF 900 MHz GSM digital mobile radio frontend of a hand portable phone." IEEE 1991 Custom Integrated Circuits Conference, Paper 7.7, describes an implementation of a direct conversion receiver which is implemented using the traditional all analog approach.

FIG. 2 shows a prior art direct conversion receiver as described in "Performance of a Direct Conversion Receiver with pi/4-dqpsk Modulated Signal," K. Anvari, M. Kaube, and B. Hriskevich, Proceedings of the 41st IEEE Vehicular Technology Conference, May 1991, pp. 822–823. The major advantage of this type of receiver is that it allows for a reduction in both size and power consumption, as compared with a double conversion receiver as in FIG. 1. A modulated RF signal is received at antenna 201 and is applied to RF section 202 including RF amplifier 204. The amplified signal from amplifier 204 is applied to AGC circuit 205, which provides to the input of RF amplifier 206 a RF signal of relatively constant amplitude, independent of the amplitude of the received signal at antenna 201. As is well known in the art, AGC circuit 205 receives its control signal from any convenient source, such as an adaptive gain control loop implemented in the baseband portion of the receiver, and for simplicity not shown in FIG. 2.

The amplified RF signal from amplifier 206 is applied to quadrature demodulator 213. This output signal from amplifier 206 is applied to mixers 220I and 220Q, which each also receives a local oscillator signal having frequency $\omega_{LO}$, but which are 90 degrees out of phase. Since the circuit of FIG. 2 is a direct conversion receiver, the local oscillator signal LO is tuned to the received signal frequency $\omega_C$. Thus, mixer 220I receives from phase splitter 219 a signal $-\sin \omega_c t$ and mixer 220Q receives from phase shifter 219 a signal $\cos \omega_c t$. Mixers 220I and 220Q provide baseband output signals, which are filtered of spurious signals by filter 221I and 221Q, amplified by amplifiers 222I and 222Q, and anti-alias filtered by filters 223I and 223Q, respectively. These I and Q baseband frequency components are applied from filters 223I and 223Q to analog to digital converter 224 (having a low pass characteristic) to provide digital I and Q baseband output signals providing the information contained in the modulated RF signal received at antenna 201.

Anvari, et al discuss various types of implementation problems with the direct conversion receiver. These are now reviewed for the purpose of showing how these problems are reduced or eliminated with the present invention.

1) Balance of Amplitude and Phase Terms

Distortion of the phasor results when the components of the I and Q channels are either uniformly distorted or differentially distorted. Anvari, et al. conclude that to avoid this type of distortion all the components in the I and Q channels require constant gain and phase characteristics across their dynamic range. To assure such constant gain and phase characteristics is difficult and costly.

2) Spurious Signal Rejection Filters

Sharp cutoff requirements for spurious signal rejection filters (such as filters 221I and 221Q of FIG. 2) cause amplitude and phase distortion for signals whose frequencies are close to the band edge. Sharp cutoff filters require a large number of filtering stages which increase complexity and cost. This is particularly true when such filters are implemented as switched capacitor filters which are difficult to implement, control, and test.

3) DC Offset in the I and Q Channels

DC offset is caused by carrier feedthrough from the high power local oscillator signals, self mixing of I and Q channels signals, 1/f noise of the operational amplifiers and mixers, and bias in the filters and amplifiers.

Anvari, et at. conclude that the problem can be eliminated by AC coupling of the signal or removing the DC offset in the digital signal processing section. Many of the modulation schemes used in personal communications require low frequency information to achieve low bit error rates. Thus predicting the DC offset in a control loop in the digital signal processor is the best prior art alternative, as this results in a lower bit error rate than is possible by simply AC coupling.

4) Sampling Time of the Analog to Digital Converter

The sampling jitter of the sample and hold used at the input to the Analog-to-Digital converter (such as Analog-to-Digital converter 224, FIG. 2) will introduce differential phase distortion between the I and Q channels.

The key elements of a receiver design are its physical size, power consumption, and cost. In the past, integration onto silicon of major portions of a portable terminal have accomplished these goals. The present invention allows for the further integration of the receiver as compared with the prior art. The present invention simplifies the construction of direct conversion receivers for a variety of personal communication systems.

SUMMARY

In accordance with the teachings of this invention, a novel direct conversion receiver is taught which utilizes a sample and hold circuit for subsampling the input signal. The output of this sample and hold circuit is applied to a Sigma-Delta loop in order to provide a high speed, low resolution data stream which is applied to a decimator which provides a high precision, low data rate signal having quadrature outputs.

DETAILED DESCRIPTION

Figure 1:
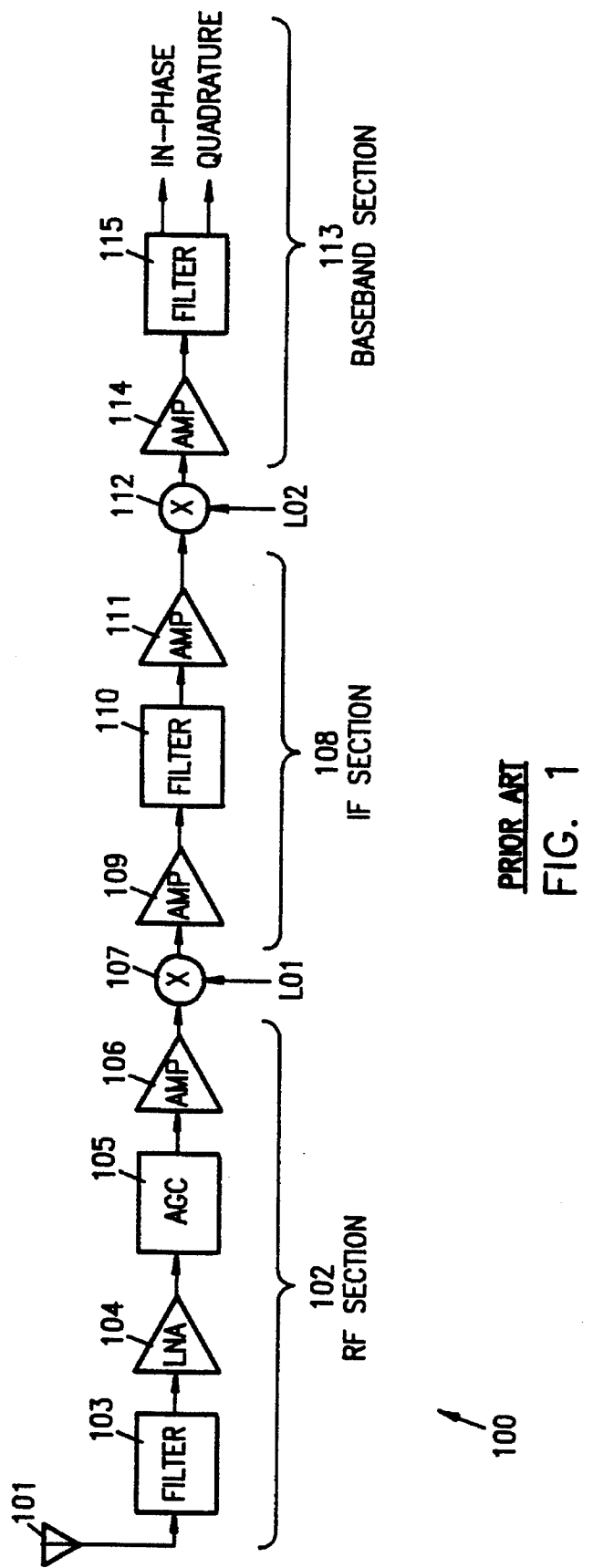
FIG. 1 is a block diagram of a typical prior art double conversion receiver.
Figure 2:
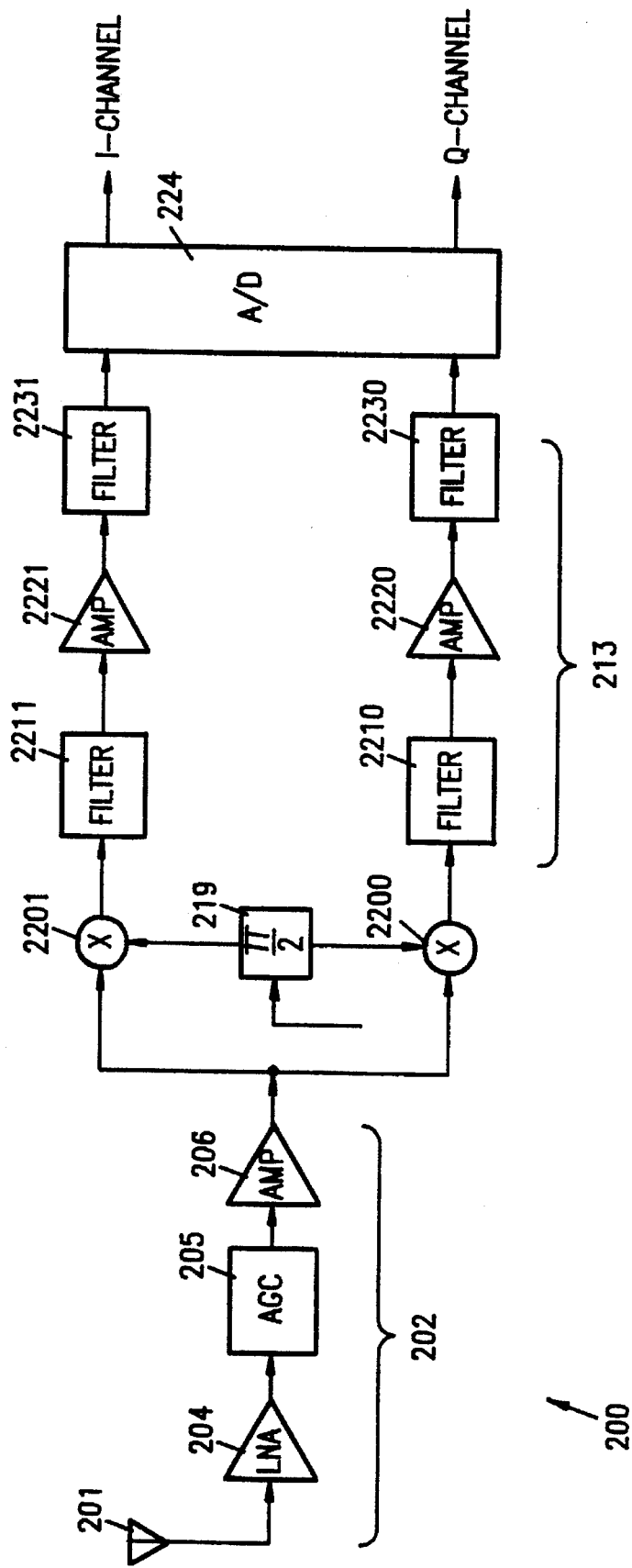
FIG. 2 is a block diagram of a typical prior art direct conversion receiver.
Figure 3:
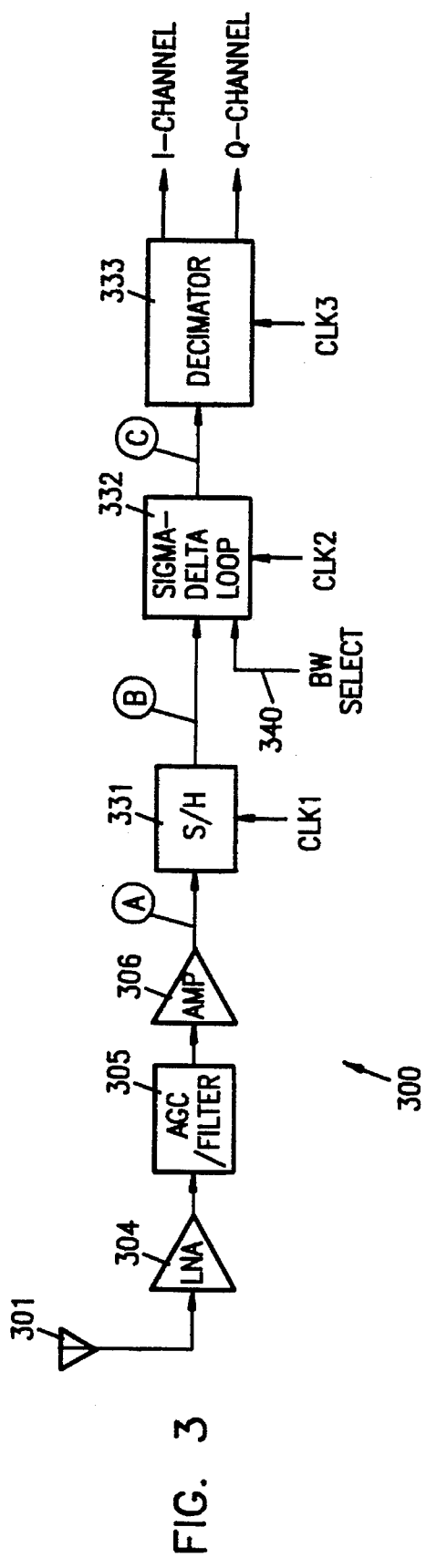
FIG. 3 is a block diagram depicting one embodiment of a direct conversion receiver constructed in accordance with the teachings of this invention.

FIG. 3 shows a block diagram of one embodiment of a novel direct conversion receiver 300 constructed in accordance with the teachings of the present invention.

Figure 5:
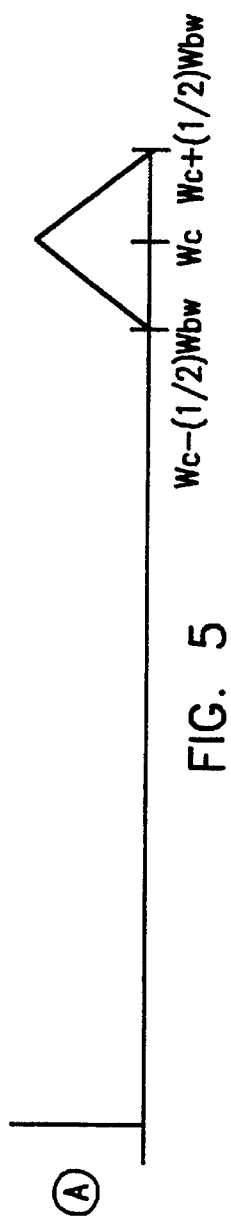
FIGS. 5–8 are graphs depicting various signals in the embodiment of FIG. 3.

The RF energy received at antenna 301 is amplified by low noise amplifier 304 and applied to AGC circuit 305. As in the prior art, the AGC control signal may be generated, for example, using an adaptive gain control loop implemented in the baseband portion of the receiver, for simplicity not shown in the block diagram of FIG. 3. The gain-controlled output signal from AGC circuit 305 is applied to amplifier 306, resulting in the output signal A from amplifier 306 having a frequency spectrum as shown in FIG. 5 including carrier frequency $\omega_c$ and covering a frequency band from $\omega_c - \frac{1}{2}\omega_{bw}$ to $\omega_c + \frac{1}{2}\omega_{bw}$, where $\omega_{bw}$ is the bandwidth of the received RF signal of interest. If desired, amplifier 306 can include some filtering characteristics, thereby providing a certain amount of selectivity with respect to the bandwidth of interest.

Figure 6:
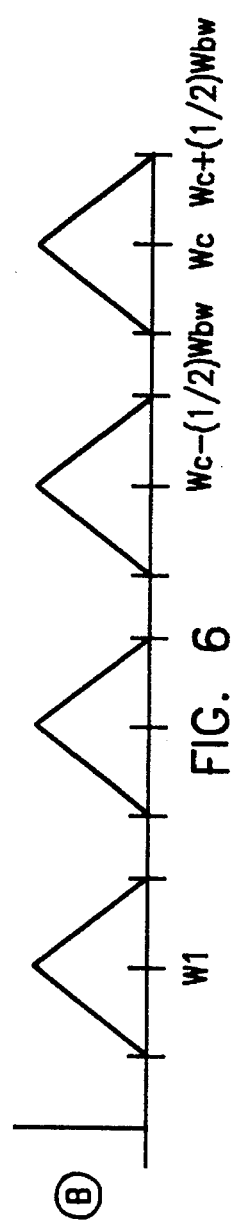

Output signal A from amplifier 306 is sub-sampled by sample and hold circuit 331 clocked by clock CLK1 having frequency $\omega_1$. Clock signal CLK1 is provided in any convenient fashion, for example from a crystal-based clock circuit (not shown), as is well known in the art. This allows the frequency of clock signal CLK1 to be conveniently adjusted, for example through the use of digital dividers, in order to establish $\omega_1$ at any desired frequency, which frequency may be programmed digitally. By "sub-sampling" signal A, sample and hold circuit 331 provides aliased copies of the original signal. The resulting signal B is shown in FIG. 6, and contains the original signal having a carrier frequency $\omega_c$ and aliased copies of that original signal centered at integral multiples of $\omega_1$, the sampling frequency of sampling hold circuit 331 defined by clock signal CLK1. Although not necessary, the implementation of decimator 333 is made more convenient if frequency $\omega_1$ of clock signal CLK1 is an integral fraction of carrier frequency $\omega_c$.

The relationship between sampling frequency $\omega_1$ and carrier frequency $\omega_c$ is dependent on the characteristics of the modulation being received, bandwidth $\omega_{bw}$ of the received signal, and the capabilities of Sigma-Delta converter 332 which receives signal B from sample and hold circuit 331. The choice of $\omega_1$ and its relationship to the decimator construction are explained with respect to one decimator suitable for use in accordance with this invention, such decimator being described in copending U.S. patent application Ser. No. 07/934,946, on an invention entitled "A Bandpass Decimation Filter Suitable for Multiple Protocols", which is hereby incorporated by reference.

Figure 7:
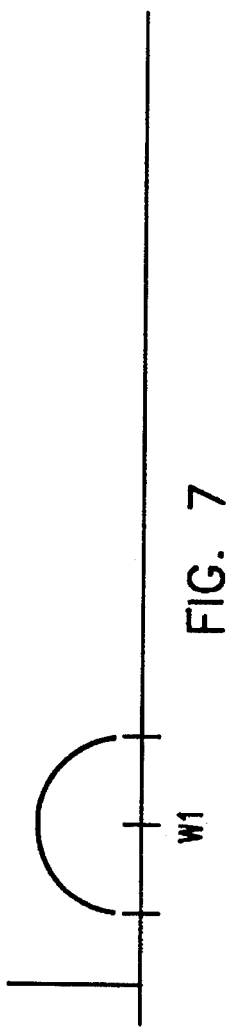

Signal B is converted by oversampling Sigma-Delta converter 332. Sigma-Delta converter 332 receives clock signal CLK2 having a frequency which is an integral multiple of the frequency of clock signal CLK1. This provides for Sigma-Delta loop 332 to oversample the output signal provided by sample and hold circuit 331 by a factor of, for example, 128 or 256 in order to provide a frequency response as shown in FIG. 7, having a center frequency $\omega_1$. In this manner, Sigma-Delta converter 332 disposes of the copies of the input signal contained in the spectrum of the output signal from sample and hold converter 331 (and shown in FIG. 6) other than that centered at frequency $\omega_1$. This provides a single aliased copy, centered at frequency $\omega_1$, for processing. Sigma-Delta converter 332 can have either a low pass conversion transfer function or a bandpass conversion transfer function, depending on the spectrum at point B and the desired characteristics of the conversion. The embodiment here described has a bandpass conversion transfer function.

One example of a Sigma-Delta loop suitable for use as Sigma-Delta converter loop 332 is described in copending U.S. patent application Ser. No. 07/935,018, now U.S. Pat. No. 5,345,406 on an invention entitled "A Bandpass Sigma Delta Converter Suitable for Multiple Protocols", which is hereby incorporated by reference.

A principal feature of Sigma-Delta loop 332 is its ability to select one of a preselected set of conversion bandwidths in response to a bandwidth selection signal applied to Sigma-Delta loop 332 via bandwidth selection port 340. The Sigma-Delta loop disclosed in the aforementioned copending application selectively converts signals from analog representation to digital representation. The signals which are converted from analog to digital are bandpass limited by Sigma-Delta loop 332 in order to obtain only those signals which are of importance for receiving the modulated information.

Figure 8:
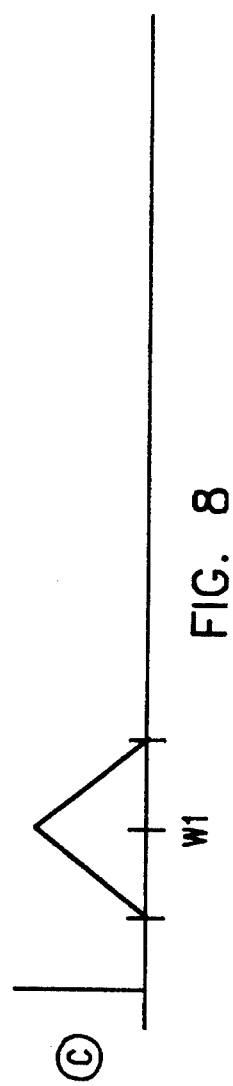

The output signal from Sigma-Delta loop 332 is a digital data stream labeled C and depicted in FIG. 8. The data rate of signal C can be as low as the data rate (CLK2) of Sigma-Delta loop 332 for the case of a one bit quantizer, or can be an integer multiple higher for the case of multibit converters or parallel converters.

Figure 4:
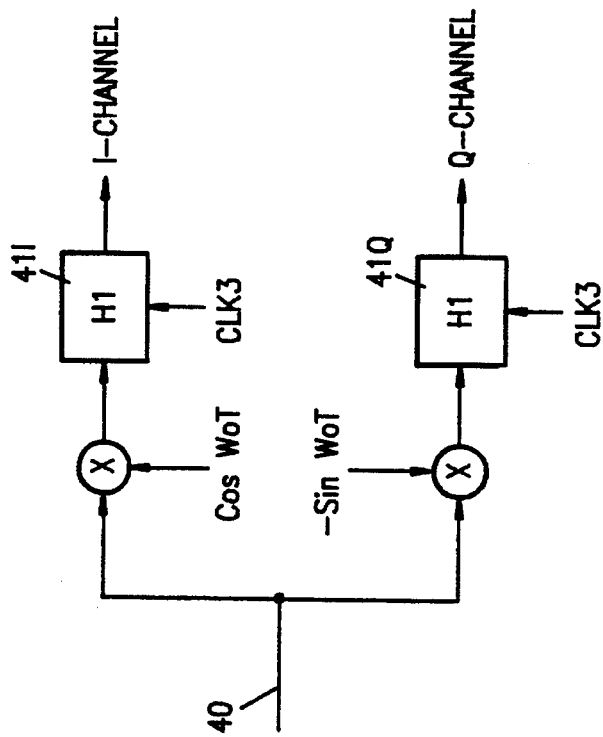
FIG. 4 is a block diagram depicting a prior art decimator suitable for use as decimator 333 of the embodiment of FIG. 3.

Decimation circuit 333, which may be of conventional design, converts signal C from a low precision, high data rate signal to a high precision, low data rate signal. FIG. 4 is a schematic diagram of a prior art circuit suitable for use as decimation circuit 333 for converting input signal C of this invention applied to its input lead 40 into an in-phase signal I and a quadrature signal Q. $\omega_o$ is chosen for convenience of the mixing operation as described in "Decimation for Bandpass Sigma-Delta Analog-to-Digital Conversion," Richard Schreier and W. Martin Snelgrove, IEEE 1990 Custom Integrated Circuits Conference, pp. 1801–1804, or for the reduction in the complexity of filters H1.

Other methods of providing decimation as provided by decimation circuit 333 are known in the prior art. Furthermore, a decimation method which is highly suitable for wireless communication signals which require timing recovery systems to derive the data recovery clock based on the received data is described in copending U.S. patent application Ser. No. 07/934,946 (attorney docket no. WIRE-003 US).

In accordance with the teachings of the present invention, a novel direct conversion receiver is taught which avoids mismatch in the processing of the I and Q channels by utilizing digital filters. Digital filters allow exact differential matches to occur in the filters. While absolute matches are a function of the quantization noise and bit precision of the arithmetic which is an easily controlled design parameter, the amplitude and phase characteristics for the I and Q processing are determined at design time and are exactly repeatable, since they are digital. Since both the I and Q channels are processed by exactly the same analog components up to the point at which they are converted to digital, these channels can be processed using digital techniques which avoid the difficulties of DC balance found in prior art receivers.

Since the spurious signal rejection filters incorporated as part of decimation circuit 333 (FIG. 3) in accordance with the teachings of the present invention can be implemented as digital filters, the characteristics of these filters can be well controlled at reasonable cost. The implementation cost can be further reduced by time division multiplexing the filters with other processing functions, when such filters are implemented utilizing a digital signal processing circuit which can be used for other purposes in addition to such filtering.

In accordance with the teachings of this invention, a number of problems noted in prior art direct conversion receivers are easily avoided. As previously noted, DC offset in the I and Q channels is caused by carrier feedthrough from the high power local oscillator signals. Because, in accordance with the teachings of this invention, the A/D conversion is performed by Sigma-Delta loop 332 on signals at IF frequencies, DC offset ceases to be a problem. Carrier feedthrough only occurs between the local oscillator (CLK2) and RF amplifiers 304, 306 since the I and Q processing is no longer analog. Thus, the feedthrough problem reduces to an easily solved problem of isolating analog components from digital signals, since in accordance with this invention the local oscillator is a digital signal. The problem of self mixing of in-channel (I) and out-of-channel (Q) signals appears in the current invention as aliasing of spurious signals into the passband of interest. This can be controlled by proper choice of mixing frequencies. Because conversion is performed at high frequencies the 1/f noise of the analog components is not of concern since 1/f noise is predominant at low frequencies. Bias in filters and amplifiers is not a problem in IF based converters.

A major advantage of a receiver constructed in accordance with the teachings of this invention is the ability to determine, after fabrication of the receiver, the type of signals that the receiver is to process via software or digital logic. The use of digital filters in decimation circuit 333 allows the characteristics of the receive signal path to be determined after fabrication. The bandwidth of the oversampled Sigma-Delta converter 332 can be determined by selection of the oversampling ratio, selection of the characteristics of the loop filter, and the characteristics of decimation filter 333. The conversion rate of the modulator, CLK2, is determined by the digital clock rates driving the modulator. This allows the modulator to adapt its sampling rates to those required by the communication protocol being converted.

Since the A/D conversion of Sigma-Delta converter 332 is based on an oversampled technique, the choice of modulator clock rate (CLK2) and decimation factor (CLK3) determine the quantization noise level of the conversion. This allows for conversion accuracy to be defined utilizing digital logic or software, thereby providing a novel receiver which is adaptable to many protocols.

All publications and patent applications mentioned in this specification are herein incorporated by reference to the same extent as if each individual publication or patent application was specifically and individually indicated to be incorporated by reference.

The invention now being fully described, it will be apparent to one of ordinary skill in the art that many changes and modifications can be made thereto without departing from the spirit or scope of the appended claims.

I claim:

1. A communications receiver comprising:

an input port configured to receive a radio frequency input signal;

a sample and hold circuit coupled to said input port and configured to receive said input signal and a first clock signal having a first clock frequency, said sample and hold circuit further configured to subsample said input signal at said first clock frequency and to provide a first frequency domain signal centered about a first intermediate frequency corresponding to said first clock frequency, said sample and hold circuit further configured to provide a set of aliased copies of said frequency domain signal, each aliased copy centered at a respective multiple of said first intermediate frequency corresponding to said first clock frequency;

a frequency selective analog to digital converter coupled to said sample and hold circuit and configured to receive a second clock signal which is an integral multiple of said first clock signal, said digital converter including a sigma-delta converter configured to receive said frequency domain signal and said aliased copies of said frequency domain signal and to provide as an output a selected one of said frequency domain signal and said aliased copies of said frequency domain signal as a selected signal, selected as a function of said second clock signal; and a decimation filter coupled to said frequency selective analog to digital converter and configured to receive said selected signal and to provide a baseband output signal corresponding to said selected signal.

2. A receiver as in claim 1 wherein said first clock signal has a programmably adjustable frequency.

3. A receiver as in claim 1 wherein said input signal has a carrier frequency, and said first clock frequency is an integral fraction of said carrier frequency.

4. A receiver as in claim 1 wherein said converter is further configured to receive a bandwidth selection signal and in response thereto to provide a predetermined frequency selective conversion characteristic.

5. A receiver as in claim 1 wherein said frequency selective analog to digital converter includes an oversampling sigma-delta converter.

6. A receiver as in claim 1 wherein said sample and hold circuit and said frequency selective analog to digital converter are implemented as an oversampling sigma-delta converter.

7. A communication receiver as in claim 1 wherein said decimation filter receives a clock signal which tracks the frequency and phase of a transmitted clock signal incorporated in said input signal.

8. A communications receiver comprising:

an input port configured to receive a radio frequency input signal;

a sample and hold circuit coupled to said input port and configured to subsample said input signal and to provide a set of aliased copies of said input signal;

a frequency selective analog to digital converter coupled to said sample and hold circuit and configured to receive said set of aliased copies of said input signal and to provide as an output a selected one of said aliased copies of said input signal, said analog-to-digital converter further configured to receive a bandwidth selection signal and in response thereto to provide a predetermined frequency selective conversion characteristic; and a decimation filter coupled to said frequency selective analog to digital converter and configured to receive said selected one of said aliased copies of said input signal and to provide a baseband output signal.

9. A receiver as in claim 8 wherein said sample and hold circuit is further configured to receive a first clock signal such that said aliased copies of said input signal are each centered at a frequency which is an integral multiple of the frequency of said first clock signal.

10. A receiver as in claim 9 wherein said first clock signal has a programmably adjustable frequency.

11. A receiver as in claim 10 wherein said analog-to-digital converter is further configured to receive a second clock signal which has a frequency that is an integral multiple of said first clock signal frequency.

12. A receiver as in claim 9 wherein said input signal has a carrier frequency, and said frequency of said first clock signal is an integral fraction of the carrier frequency of said input signal.

13. A receiver as in claim 8 wherein said frequency selective analog to digital converter includes an oversampling sigma-delta converter.

14. A receiver as in claim 8 wherein said sample and hold circuit and said frequency selective analog to digital converter are implemented as an oversampling sigma-delta converter.

15. A communications receiver as in claim 8 wherein said decimation filter receives a clock signal which tracks the frequency and phase of a transmitted clock incorporated in said input signal.

16. A communications receiver comprising:

an input port configured to receive a radio frequency input signal;

a sample and hold circuit coupled to said input port and configured to subsample said input signal and to provide a set of aliased copies of said input signal;

a frequency selective analog to digital converter coupled to said sample and hold circuit and configured to receive said set of aliased copies of said input signal and to provide as an output a selected one of said aliased copies of said input signal, said analog-to-digital converter further configured to receive a bandwidth selection signal and in response thereto to provide a predetermined frequency selective conversion characteristic; and a decimation filter coupled to said frequency selective analog to digital converter and configured to receive said selected one of said aliased copies of said input signal and to provide a baseband output signal, said decimation filter also configured to receive a clock signal which tracks the frequency and phase of a transmitted clock signal incorporated in said input signal.

17. A receiver as in claim 16 wherein said sample and hold circuit is configured to receive a first clock signal such that said aliased copies of said input signal are each centered at a frequency which is an integral multiple of the frequency of said first clock signal.

18. A receiver as in claim 17 wherein said first clock signal has a programmably adjustable frequency.

19. A receiver as in claim 18 wherein said analog-to-digital converter is further configured to receive a second clock signal which has a frequency that is an integral multiple of said first clock signal frequency.

20. A receiver as in claim 17 wherein said input signal has a carrier frequency, and said frequency of said first clock signal is an integral fraction of the carrier frequency of said input signal.

21. A receiver as in claim 16 wherein said frequency selective analog to digital converter includes an oversampling sigma-delta converter.

22. A receiver as in claim 16 wherein said sample and hold circuit and said frequency selective analog to digital converter are implemented as an oversampling sigma-delta converter.

* * * * *